(12) United States Patent
Lee et al.

(10) Patent No.: US 7,097,047 B2
(45) Date of Patent: Aug. 29, 2006

(54) CABLE MANAGEMENT FLIP TRAY ASSEMBLY

(75) Inventors: Daniel G. Lee, Austin, TX (US); Randolph D. Gray, Round Rock, TX (US); Corey D. Hartman, Round Rock, TX (US); Terrence Q. Rafferty, Salisbury, NC (US); Tiffany J. Williams, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 212 days.

(21) Appl. No.: 10/675,102

(22) Filed: Sep. 30, 2003

(65) Prior Publication Data

US 2005/0067358 A1    Mar. 31, 2005

(51) Int. Cl.
*A47F 7/00* (2006.01)

(52) U.S. Cl. ............ 211/26.2; 361/825; 312/223.6; 312/323

(58) Field of Classification Search .......... 211/26.2, 211/26; 361/825, 826; 312/223.6, 323
See application file for complete search history.

(56) References Cited

U.S. PATENT DOCUMENTS

| | | | |
|---|---|---|---|
| 2,630,364 A * | 3/1953 | Gleason | 312/323 |
| 3,133,768 A | 5/1964 | Klakovich et al. | 308/3.6 |
| 3,356,432 A * | 12/1967 | Mariotte et al. | 312/323 |
| 3,680,711 A | 8/1972 | Brucker | 211/105.3 |
| 3,697,034 A | 10/1972 | Shell | 248/243 |
| RE29,371 E * | 8/1977 | De Bortoli et al. | 174/60 |
| 4,184,726 A | 1/1980 | Cox | 312/320 |
| 4,406,374 A | 9/1983 | Yedor | 211/192 |
| 4,731,029 A | 3/1988 | Lerner et al. | 439/4 |
| 4,931,907 A | 6/1990 | Robinson et al. | 361/391 |
| 5,018,052 A | 5/1991 | Ammon et al. | 361/428 |
| 5,169,221 A * | 12/1992 | Wheeler | 312/323 |
| 5,216,579 A | 6/1993 | Basara et al. | 361/383 |
| 5,306,077 A * | 4/1994 | Trevaskis | 312/122 |
| 5,460,441 A | 10/1995 | Hastings et al. | 312/298 |
| 5,505,533 A | 4/1996 | Kammersgard et al. | 312/236 |
| 5,546,277 A | 8/1996 | Zandbergen | |
| 5,571,256 A | 11/1996 | Good et al. | 211/26 |
| 5,579,924 A | 12/1996 | Sands et al. | 211/26 |
| 5,655,738 A | 8/1997 | Ragsdale et al. | 248/68.1 |
| 5,684,671 A | 11/1997 | Hobbs et al. | 361/683 |
| 5,791,498 A | 8/1998 | Mills | 211/26 |
| 5,833,337 A | 11/1998 | Kofstad | 312/334.5 |
| 5,850,925 A | 12/1998 | Gandre | 211/26 |
| 5,884,609 A | 3/1999 | Kawamoto et al. | 123/520 |
| 5,890,602 A | 4/1999 | Schmitt | 211/26 |

(Continued)

FOREIGN PATENT DOCUMENTS

DE          3643486 A1 *    7/1988

OTHER PUBLICATIONS

Pending U.S. Appl. No. 10/278,263 entitled "System and Method for Rack Cable Management" by Corey D. Hartman, et al.; Dell Products L.P., filed Oct. 23, 2002.

(Continued)

*Primary Examiner*—Blair M. Johnson
(74) *Attorney, Agent, or Firm*—Baker Botts L.L.P.

(57) ABSTRACT

A system and method for providing a cable management flip tray assembly includes a flip tray mounting bracket and a flip tray. The flip tray is moveable between a first, generally vertical, position and a second, generally horizontal, position that facilitates access to an information handling system component stored within the rack.

16 Claims, 5 Drawing Sheets

U.S. PATENT DOCUMENTS

| | | | |
|---|---|---|---|
| 5,893,593 A | 4/1999 | Dowling | 292/336.3 |
| 5,921,402 A | 7/1999 | Magenheimer | 211/26 |
| 5,941,621 A | 8/1999 | Boulay et al. | |
| 5,971,508 A * | 10/1999 | Deimen et al. | 312/223.6 |
| 6,011,701 A | 1/2000 | Kopp et al. | 361/818 |
| 6,021,047 A | 2/2000 | Lopez et al. | 361/727 |
| 6,021,909 A | 2/2000 | Tang et al. | |
| 6,070,742 A | 6/2000 | McAnally et al. | 211/26 |
| 6,070,841 A | 6/2000 | Robinson | 248/220.43 |
| 6,070,957 A | 6/2000 | Zachrai | 312/334.4 |
| 6,071,742 A | 6/2000 | Tracy et al. | 435/320.1 |
| 6,076,198 A | 6/2000 | Meierdierck | 4/243.2 |
| 6,095,345 A | 8/2000 | Gibbons | 211/26 |
| 6,142,590 A | 11/2000 | Harwell | 312/223.1 |
| 6,181,549 B1 | 1/2001 | Mills et al. | 361/683 |
| 6,185,092 B1 | 2/2001 | Landrum et al. | 361/683 |
| 6,185,098 B1 | 2/2001 | Benavides | 361/695 |
| 6,193,341 B1 * | 2/2001 | Eizadkhah et al. | 312/323 |
| 6,223,908 B1 | 5/2001 | Kurtsman | 211/26 |
| 6,230,903 B1 | 5/2001 | Abbott | 361/829 |
| 6,273,534 B1 | 8/2001 | Bueley et al. | 312/334.8 |
| 6,297,962 B1 | 10/2001 | Johnson et al. | 361/726 |
| 6,303,864 B1 | 10/2001 | Johnson et al. | 174/69 |
| 6,305,556 B1 | 10/2001 | Mayer | 211/26 |
| 6,326,547 B1 | 12/2001 | Saxby et al. | 174/69 |
| 6,327,139 B1 * | 12/2001 | Champion et al. | 361/608 |
| 6,365,834 B1 | 4/2002 | Larsen et al. | 174/100 |
| 6,373,721 B1 | 4/2002 | Lecinski et al. | 361/826 |
| 6,398,041 B1 | 6/2002 | Abbott | 211/26 |
| 6,398,149 B1 | 6/2002 | Hines et al. | 242/399 |
| 6,407,933 B1 | 6/2002 | Bolognia et al. | 361/826 |
| 6,422,399 B1 | 7/2002 | Castillo et al. | 211/26 |
| 6,429,376 B1 | 8/2002 | Mendoza | 174/97 |
| 6,431,668 B1 | 8/2002 | Reddicliffe | 312/334.5 |
| 6,435,354 B1 | 8/2002 | Gray et al. | 211/26 |
| 6,554,142 B1 | 4/2003 | Gray | 211/26 |
| 2003/0026084 A1 | 2/2003 | Lauchner | 361/826 |
| 2003/0123832 A1 | 7/2003 | Adapathya et al. | 385/135 |

OTHER PUBLICATIONS

Pending U.S. Appl. No. 09/518,841 entitled "Rack Mount Slide System Enabling Front Top and Rear Access to a Rack Mounted Device" by Alfred Rafi Baddour, et al.; Dell Products L.P., filed Mar. 3, 2000.

Pending U.S. Appl. No. 10/393,620 entitled "Tool-less Cable Management Attachment Bracket and Method of Use" by Tiffany J. Williams; Dell Products L.P., filed Mar. 21, 2003.

Pending U.S. Appl. No. 10/206,302 entitled "System and Method for Utilizing Non-Dedicated Rack Space" by Terrence Q.E. Rafferty et al.; Dell Products L.P., filed Jul. 26, 2002.

Figures for Pending U.S. Appl. No. 10/206,302 entitled "System and Method for Utilizing Non-Dedicated Rack Space" by Terrence Q.E. Rafferty et al.; Dell Products L.P., filed Jul. 26, 2002.

Figures for Pending U.S. Appl. No. 10/393,620 entitled "Tool-less Cable Management Attachment Bracket and Method of Use" by Tiffany J. Williams; Dell Products L.P., filed Mar. 21, 2003.

Figures for Pending U.S. Appl. No. 10/278,263 entitled "System and Method for Rack Cable Management" by Corey D. Hartman, et al.; Dell Products L.P., filed Oct. 23, 2002.

Figures filed in Pending U.S. Appl. No. 09/518,841 entitled "Rack Mount Slide System Enabling Front, Top and Rear Access to a Rack Mounted Device" by Baddour et al., assigned to Dell Products L..P., filed Mar. 3, 2000.

Cabling Reference for the HP NetServer LXr Pro, Chapter 4, pp. 46-48, no date.

IBM Magstar MP 3570 Tape Subsystem OPerator Guide C-Series Models "Installing the Rack-Mounted 3570" pp. 86-98, no date.

IBM Magstar MP 3570 Tape Subsystem Operator Guide C-Series Models Attaching SCSI and Power Cables to Model C21 (Single Drive with Single Host) 1 page, no date.

J1478A—HP Cable Management Arm for LHx000r by Hewlett Packard 1 page, Feb. 24, 2000.

Compaq AlphaServer ES40 Rackmount System Installation Guide "Installing the Cable Management Arm," pp. 18-21, no date.

Compaq ProLiant ML350 Tower-to-Rack Conversion Guide 2 pages, no date.

Compaq Rack Products Reference Guide "Installing Components in the Rack," 5 pages, no date.

Maintenance and Service Guide "Illustrated Parts Catalog Chapter 1—Illustrating the family of Compaq Rack-Mountable ProLiant 1500R Servers," 3 pages, no date.

Compaq ProLiant DL360 Ultra-Dense Server Deployment in Compaq Racks "4.6.3.2. Sliding-Rail Cable Management" pp. 89-90, no date.

Netra t1 and Netra st D130 Rackmount Installation Chapter 2 pp. 9-14, Jun. 2000.

* cited by examiner

CABLE MANAGEMENT FLIP TRAY ASSEMBLY

TECHNICAL FIELD

The following disclosure relates generally to the field of electronic systems and more specifically to a cable management tray for use with information handling systems stored in racks.

BACKGROUND

As the value and use of information continues to increase, individuals and businesses seek additional ways to process and store information. On option available to users is information handling systems. An information handling system generally processes, compiles, stores, and/or communicates information or data for business, personal or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One type of information handling system is a modular information handling system such as a so called "blade" server or "brick" server. A blade server generally includes a midplane that allows multiple blades to be associated therewith. Each blade typically includes a processor and memory components. A blade server may include, for instance, six or more blades which may be interconnected through the midplane and may share certain resources such as a power source, management controller and network interface card. In many instances blade servers may allow for "hot swapping". During a hot swapping operation, individual blades may be removed from or installed within the blade server chassis while the blade server is operating. For blade servers which are installed within rack systems, however, gaining access to the blades (which are often accessed via the rear portion of the blade server) is often problematic because of the physical interference from cabling associated with the blade server as well as the cable management arm. The cabling associated with the blade server and the cable management arm typically prevent easy access to the rear of the blade server to allow for efficient hot swapping of blades.

SUMMARY OF THE INVENTION

Therefore a need has arisen for a cable management system to allow for the convenient access to the rear portion of information handling systems stored within rack servers.

A further need has arisen for a cable management system that facilitates hot swapping of blades in and out of blade servers.

In accordance with teachings of the present disclosure, a system and method are described for providing a cable management flip tray assembly that includes a flip tray mounting bracket and a flip tray. The flip tray is moveable between a first, generally vertical, position and a second, generally horizontal, position that facilitates the installation and removal of blades into and out of a blade server stored within the rack.

In one aspect a rack system is described for storing information handling system components. The rack includes four rails that each have a standard interface. A cable management flip tray assembly includes a flip tray that is moveably mounted to a flip tray mounting bracket. The flip tray mounting bracket is attached to two of the rails. The flip tray is moveably mounted to the flip tray mounting bracket moveable between a first, generally vertical, position and a second, generally horizontal, position to allow access to an information handling system component stored within the rack.

In another aspect, a cable management flip tray assembly includes a flip tray mounting bracket and flip tray. The flip tray mounting bracket may be removably mounted on a rack and the flip tray is mounted onto the flip tray mounting bracket. The flip tray may be movable between a first, generally horizontal, position and a second, generally horizontal, position. The flip tray also includes one or more retainer elements for securing cabling.

In yet another aspect, a method of managing cabling associated with an information handling system component is disclosed that includes mounting an information handling system in a rack and mounting a cable management flip tray assembly to the rack in a position adjacent to the information handling system component. Cabling associated with the information is secured to the flip tray with the flip tray positioned in a generally horizontal position, modular components can be installed in the information handling system. The flip tray is then moved into a generally vertical position proximate the information handling system.

The present disclosure includes a number of important technical advantages. One important technical advantage is providing a flip tray moveable between a first, generally vertical, position and a second, generally horizontal, position. This allows for advantageous easy access to the rear portion of information handling system components stored in racks and particularly allowing for the hot swapping of modular components such as blades within modular servers. All, some, or none of these technical advantages may be present in various embodiments of the present disclosure and other technical advantages will be readily apparent to those skilled in the art in the following figures, descriptions and claims.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
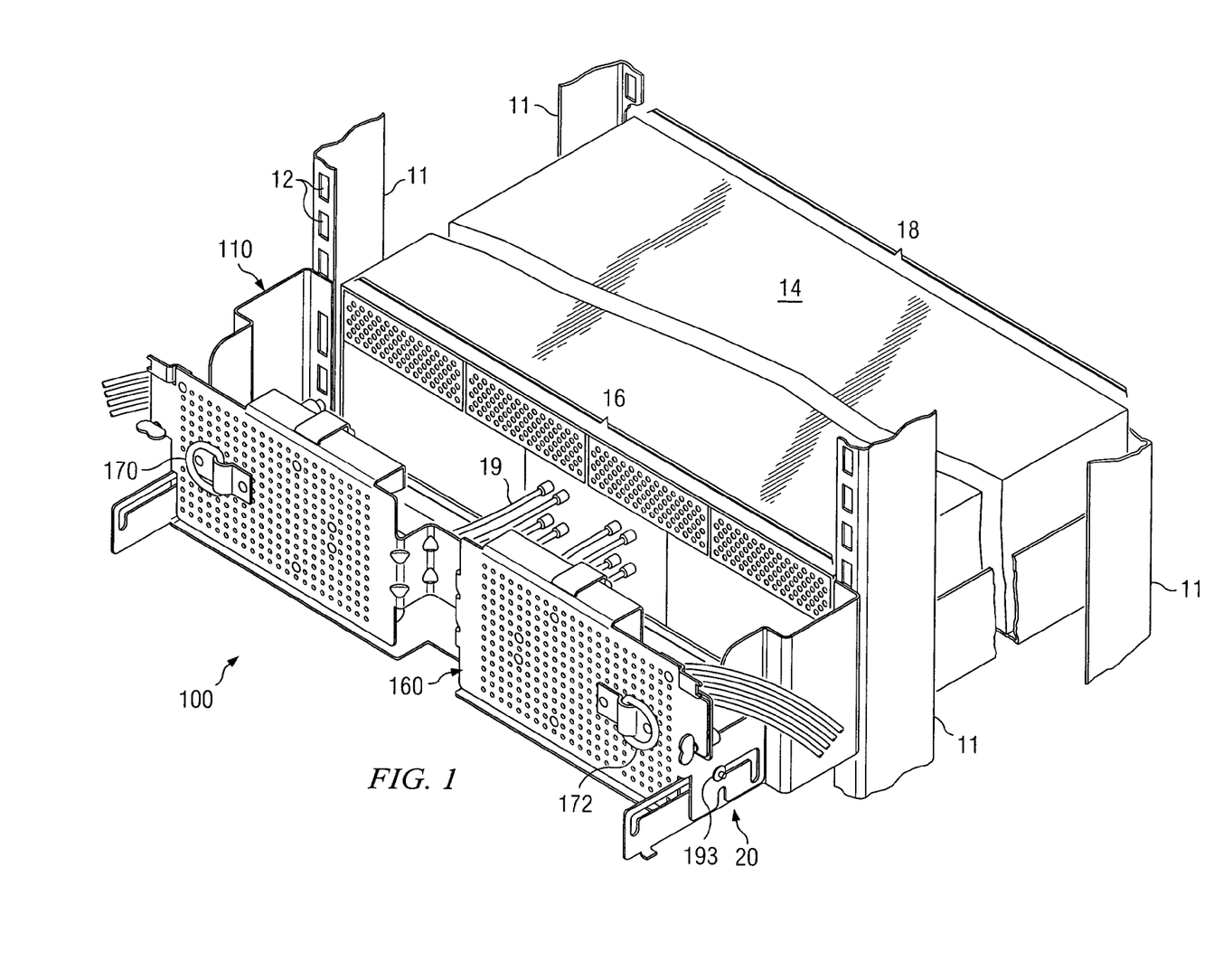
FIG. 1 shows a standard rack, with portions removed, an information handling system component installed and a cable management flip tray assembly according to the present disclosure.

Now referring to FIG. 1, a rack indicated generally at 10 is shown. Rack 10 generally includes four rails 11 that each have a standard mounting interface 12. Rack 10 may further include top, front, rear and side panels (not expressly shown). In this preferred embodiment, rack 10 is compliant with Electronics Industry Association standard 310 (EIA-310) including standard mounting interface 12. More particularly, standard mounting interface 12 includes EIA-310 compliant rectangular mounting holes spaced in mounting units also referred to as "U's." Each mounting unit there are three mounting holes.

In the present embodiment information handling system 14 is installed within rack 10. In the present embodiment information handling system component 14 further comprises a modular information handling system which may also be referred to as a blade server or a brick server. In one preferred embodiment blade server 14 includes multiple modular components installed therein such as blade servers or modular blower components.

Figure 2:
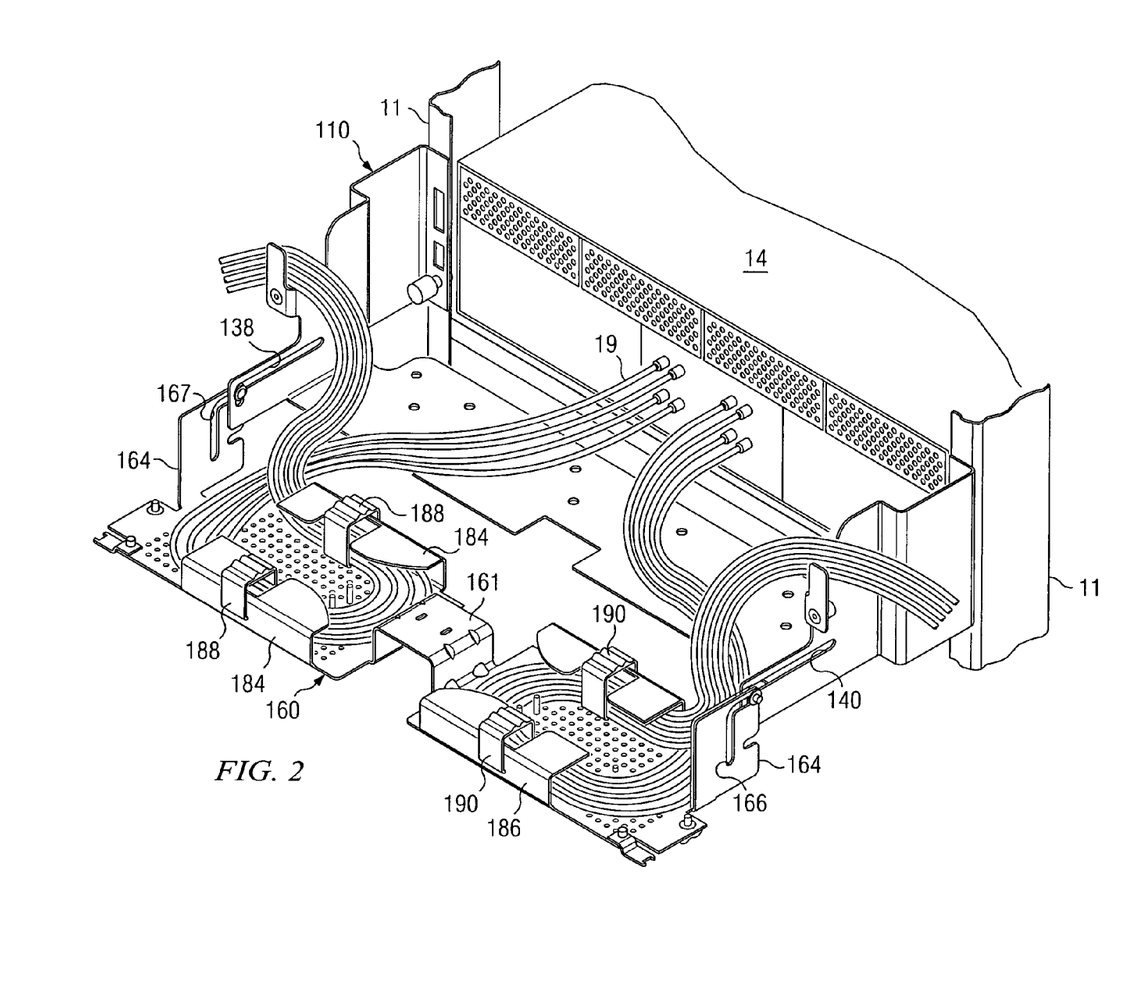
FIG. 2 shows the rack system of FIG. 1 with the flip tray in a second, generally horizontal, position, providing access to the rear portion of the information handling system component.

Cable management flip tray assembly 100 is mounted onto rack 10 generally behind and proximate to information handling system component 14. Cable management flip tray assembly 100 includes flip tray mounting bracket 110 and flip tray 160 attached thereto. As shown, flip tray mounting bracket 110 is mounted onto rack rails 11 and flip tray 160 is moveably mounted onto flip tray mounting bracket 110. As shown, flip tray 160 is in first position 20 wherein flip tray 160 is in a generally vertical position behind and proximate to. Flip tray 160 may be moved into a second position as shown in FIG. 2. In the present embodiment flip tray 160 includes pull handles 170 and 172 to facilitate movement of slip tray 160 from first position 20 to second position 30 as shown in FIG. 2.

As shown in FIG. 1, rack 10 has a rack front side 16 and a rack back side 18. In the view of FIG. 1, cable management flip tray assembly 100 is mounted onto the backside 18 of rack 10 behind and proximate to the back side of information handling system component 14. However in alternate embodiments cable management flip tray assembly 100 may be applicable for use for any side of an information handling system component that requires both cable management and periodic physical access for hot swapping of components or for installation, inspection or maintenance purposes.

Now referring to FIG. 2, a perspective view of rack 10 with information handling system component 14 installed therein. In the present embodiment, Cable management flip tray assembly 100 is shown in second position 30 in a generally horizontal position. Further, in the present preferred embodiment second position 30 is such that flip tray 160 is disposed in a generally lower position than information handling system component 14 to facilitate complete access to the rear portion of information handling system 14. Flip tray 160 also includes first cable retainer bracket 184 and second cable retainer bracket 186. Cable retainer brackets 184 and 186 allow for the disposition and management of cabling 40 associated with information handling system 14.

Figures 3, 4:
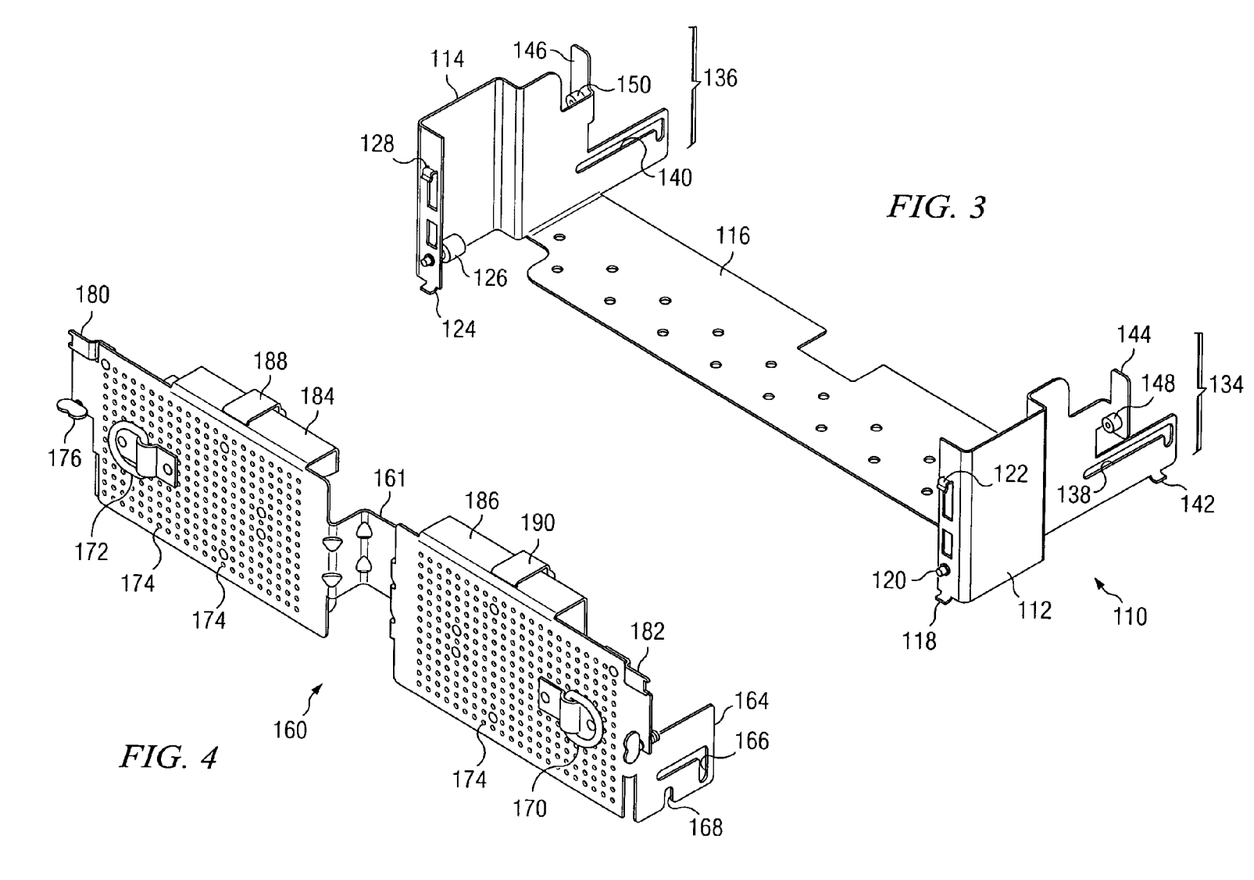
FIG. 3 shows a perspective view of a flip tray mounting bracket according to teachings of the present disclosure.
FIG. 4 shows a perspective view of a flip tray according to teachings of the present disclosure.

Now referring to FIG. 3, a perspective view of flip tray mounting bracket 110 is shown. Flip tray mounting bracket 110 includes first end 112 and second end 114 connected by bottom support 116. First end 112 and second end 114 have a generally vertical disposition, bottom support 116 has a generally horizontally disposed support that connects the first end 112 and second end 114. In an alternate embodiment first end 112 and second end 114 may be connected by a top support connecting the top portions of first end 112 and second end 114. First end 112 includes a first rack attachment interface 130 and a first flip tray mounting interface 134. Second end 114 includes a second rack interface 132 and a second flip tray mounting interface 136. First rack attachment interface 130 includes hook 122, fastener 120 and tab 118. Hook 122 and tab 118 are designed for insertion into a standard mounting interface 112 of rack rails 11. First rack attachment interface 130 preferably allows for the toolless mounting of first end 112 to rack interface 12. In a preferred embodiment, first rack attachment interface 130 also includes fastener 120 to secure first end 112 to EIA-310 compliant a rack rail. In a particular embodiment fastener 120 comprises a thumb screw that allows for the first end 112 to be tool-lessly secured to rack rail 11. Similarly, second rack attachment interface 132 includes hook 128 and tab 124 for attaching to standard mounting interface 112 of rack rail 11. In the present embodiment second rack attachment interface 132 also includes fastener 126 for securing second rack attachment interface 132 to a rack rail 11.

First end 112 also includes first flip tray mounting interface 134. In the present embodiment first flip tray mounting interface 134 includes L-shaped slot 138, tab 142 and stop 144, including fastener receiver 148. Similarly, second flip tray mounting interface 136 includes L-shaped slot 140, tab 142 (not expressly shown), stop 146 and fastener receiver 150. In the present embodiment, slots 138 and 140 generally include a horizontal slot portion and a descending vertical slot portion. More particularly, the descending vertical slot is formed at the end of the horizontal slot near the rearward portion of first end 112 and second end 114, creating a downwardly disposed L-shaped slot. In alternate embodiments, slots 134 and 138 may comprise an alternate geometry such as a straight slot or a curved slot.

Tab 142 is provided to aid in the positioning of flip tray 160 as described further with respect to FIG. 6 below. Stop 144 in the present embodiment includes a member that extends outward from the body of first end 112 and stop 146 extends outward from the body of second end 114. Stops 144 and 146 provide a surface to limit the advancement of flip tray 160 into the first position 20 as well as a surface to which flip tray 160 abut. Stops 144 and 146 also include fastener receivers 148 and 150 for securing flip tray 160 in first position 20 as shown in FIG. 1.

Now referring to FIG. 4, a perspective view of flip tray 160 is shown. Flip tray 160 includes flip tray body 161 having first mounting member 162 and second mounting member 164 extending from the respective ends of flip tray body 161. As shown in the present embodiment, second mounting member 164 extends generally perpendicular to flip tray body 161 and includes mounting slot 166. First mounting member 162 also includes a corresponding attachment slot 167 (as shown in FIG. 6). Slots 166 and 167 are formed and spaced to align with slot 138 and slot 140 respectively. In the present embodiment, slots 166 and 167 are both L-shaped slots. In alternate embodiments, slots 166 and 167 may comprise any suitable geometry. Slot 166 and 167 generally include a horizontal leg and a descending vertical leg. Second mounting member 164 also includes notch 168. In a particular embodiment notch 168 provides clearance in order to use cable tray 160 on the lowest U of rack 10.

Flip tray 160 also includes first cable retainer bracket 184 and second cable retainer bracket 186. Cable retainer brackets 184 and 186 are formed to facilitate storage of cabling 40 associated with an associated information handling system component. Cable retainer brackets 184 and 186 comprise L-shaped bodies extending from the top portion and bottom portion of flip tray body 161. Flip tray 160 also includes straps 188 and 190 associated with retainer brackets 184 and 186 respectively for securing cabling 40 as shown in FIG. 2. In the present embodiment, flip tray 160 includes tabs 180 and 182 which may be used to mount a status indicator associated with an information handling system component. In some embodiments, the status indicator may be referred to as a "cyclops."

Flip tray 160 also includes fasteners 176 and 178 to be used to secure flip tray 160 into first position 20. Specifically, fastener 178 may interface with fastener receiver 150 and fastener 176 may interface with fastener receiver 148 to secure flip tray 160 into first position 20. Flip tray 160 also includes a plurality of perforations 174 formed in flip tray body 161. Perforations 174 preferably allow air flow through flip tray body 161.

Figure 5:
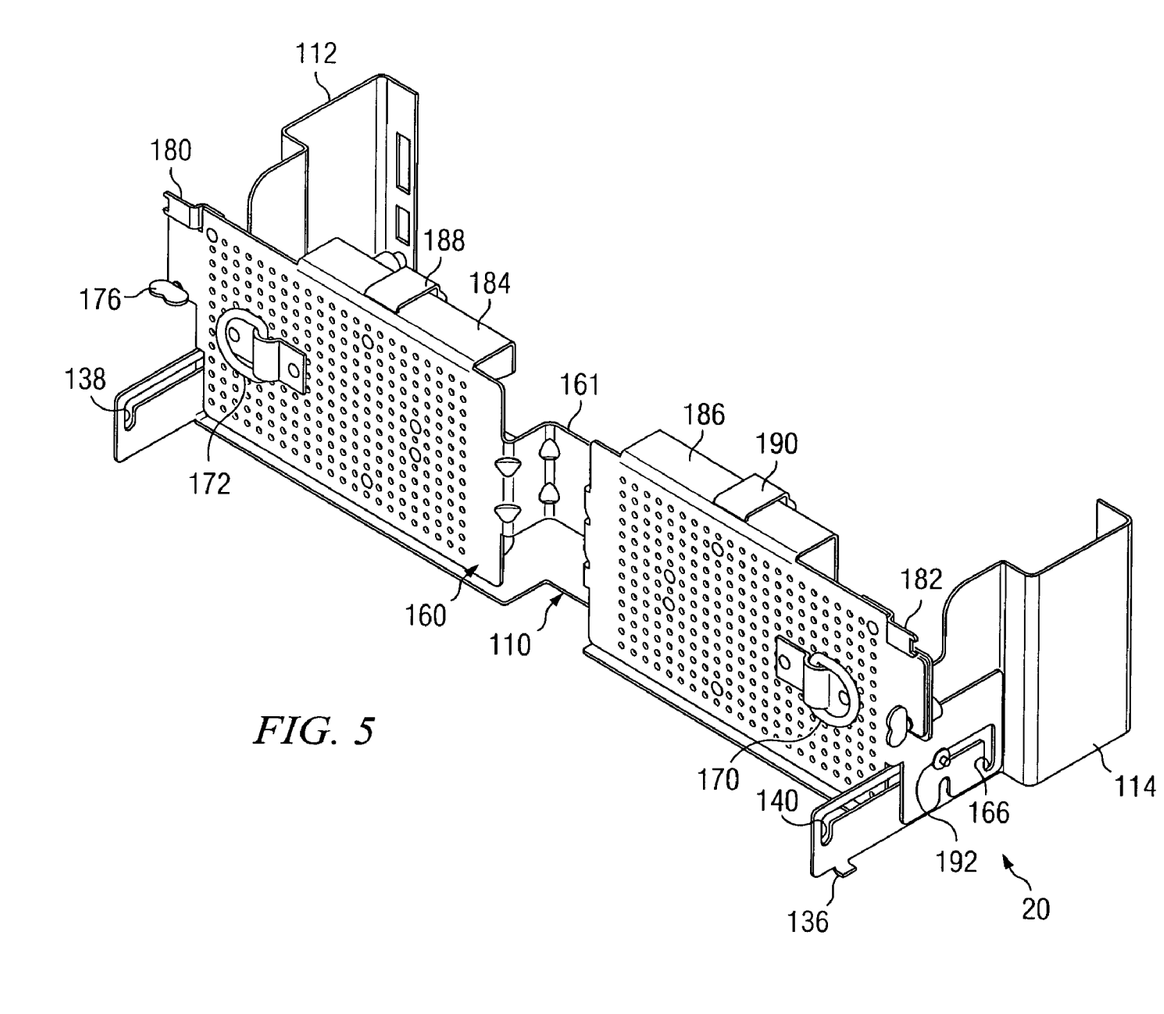
FIG. 5 shows a perspective view of a cable management flip tray assembly with the flip tray in a first, generally vertical, position.

Now referring to FIG. 5, a perspective view of flip tray 160 mounted to flip tray mounting bracket 110 in the first position 20 is shown. In the present preferred embodiment, first mounting member 162 and second mounting member 164 are aligned with the first flip tray mounting interface 134 and second flip tray interface 136, respectively, and both are secured by pins 192. In the present embodiment, in first position 20, pin 192 allows flip tray 160 to advance to become adjacent to stops 144 and 146 and to further allow fasteners 178 and 176 to be secured to fastener receivers 150 and 148 respectively. In the present preferred embodiment, pin 192 associates slot 166 with slot 140 and second pin associates the slot of first mounting member 162 with L-shaped slot 138. In the first embodiment in first position 20 flip tray 160 advances such that pin 192 aligns ends of slots 166 and 140 as well as the slot 167 with slot 138.

Figure 6:
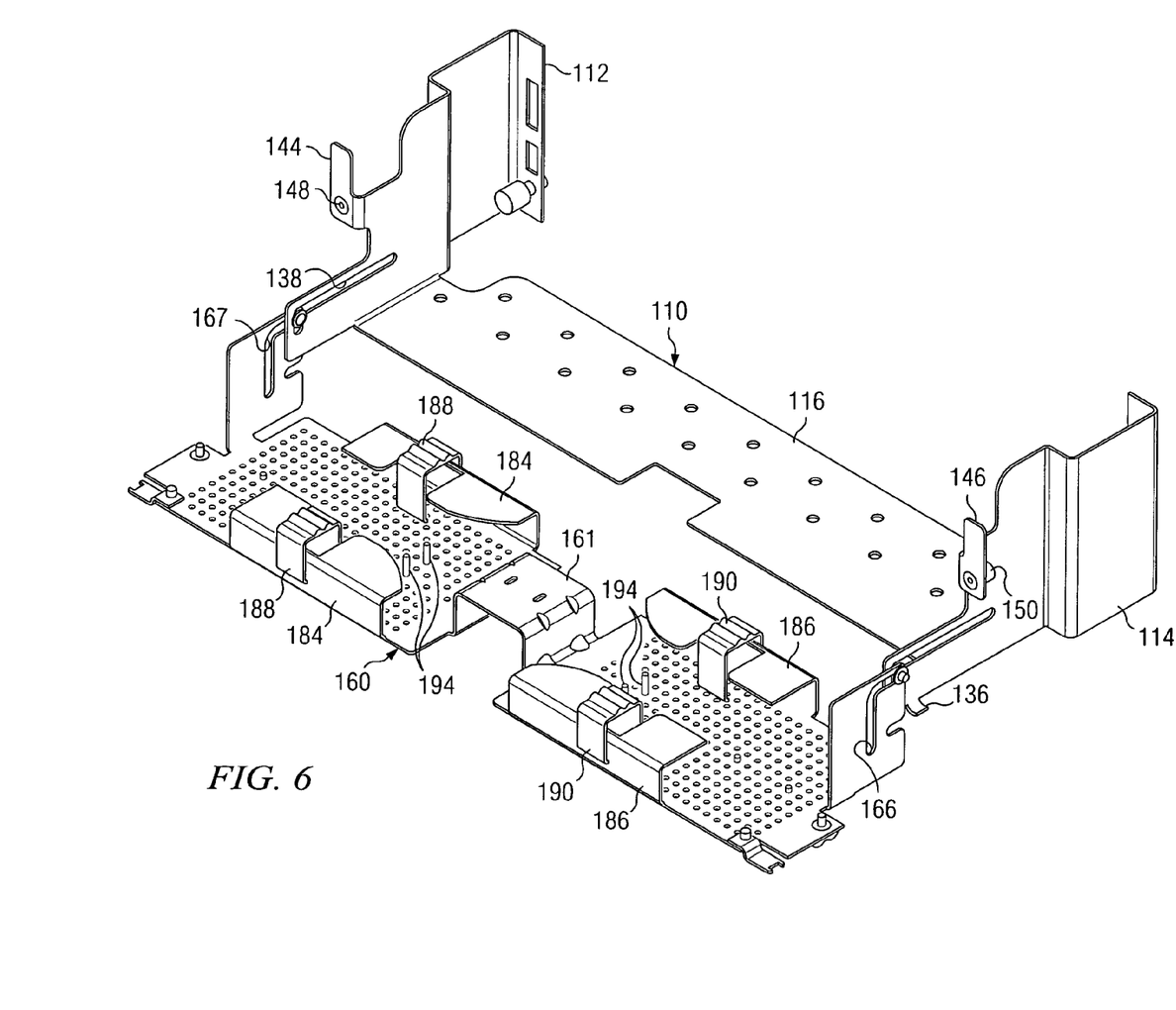
FIG. 6 shows a cable management flip tray assembly with the flip tray in a second, generally horizontal, position.

Now referring to FIG. 6, a perspective view of flip tray 160 mounted onto flip tray mounting bracket 110 in second position 30 is shown. Flip tray 161 includes first cable retainer brackets 184 and second cable retainer brackets 186 on respective ends of flip tray body 161. In alternate embodiments any suitable cable retainer brackets may be employed. Also in the present embodiment bend radius post 194 are included to facilitate a useful bend radius for cabling 40 stored within retainer brackets 184 and 186.

In operation, flip tray mounting bracket 110 may be mounted to rack 10. First rack attachment interface 130 and second rack attachment interface 132 are preferably aligned with standard mounting interface 12 of rack rails 11, preferably directly behind an associated information handling system. Flip tray mounting bracket 110 is preferably mounted on rack 10 such that cable management flip tray assembly 100 will be housed within the same vertical envelope as the associated information handling system. In a preferred embodiment, flip tray mounting bracket 110 is housed within the 3U vertical envelope as the associated information handling system.

Flip tray 160 is then aligned with flip tray mounting bracket 110. In the present embodiment, slots 166 and 162 are aligned with slots 140 and 138 respectively, and a pin 192 is inserted through each respective pair of slots. Pins 192 may be any suitable fastener for associating slots 166 and 167 with slots 140 and 138. Flip tray 160 may be disposed in a generally horizontal position to allow for access to the rear portion of the associated information handling system and to provide a user with convenient access to the cable retainer brackets 184 and 186 to dispose cabling 40 associated with the associated information handling system. The horizontal position also provides access for the installation or removal of components within the information handling system, in particular, so-called hot-swapping operations. During normal operation, flip tray 160 may be moved to a generally vertical position, directly behind the associated information handling system and abutting stops 140 and 146. Flip tray 160 may further be secured in the vertical position using fasteners 176 and 178.

Although the disclosed embodiments have been described in detail, it should be understood that various changes, substitutions and alterations can be made to the embodiments without departing from their spirit and scope.

What is claimed is:

1. A rack system for storing an information handling system component comprising:
   a rack having four rails, each rail having a standard interface portion;
   a cable management flip tray assembly comprising a flip tray mounting bracket and flip tray mounted thereto;
   the flip tray mounting bracket selectively mounted to the standard interface portions of two rails;
   the flip tray having at least one retainer for managing cabling associated with an information handling system stored in the rack, the flip tray selectively moveable between a first, generally vertical, position and a second, generally horizontal, position operable to facilitate access to the information handling system component stored within the rack; and
   wherein the rack is configured for an information handling system comprising a blade server operable to house multiple blades and wherein the flip tray second position allows for the installation and removal of blades therein.

2. The rack system of claim 1 wherein the rack rails each comprise a plurality of rectangular mounting holes.

3. The rack system of claim 1 wherein the rack comprises a front side and a back side, the cable management flip tray assembly mounted to the back side of the rack.

4. The rack system of claim 1 further comprising the cable management flip tray assembly sized to be mounted in an approximately 5.25 inch vertical envelope within the rack.

5. The rack system of claim 1 wherein:
the flip tray mounting bracket comprises a first end and a second end connected by a bottom support member;
the first end and the second end having a generally vertical disposition, the bottom support having a generally horizontal disposition; and
the first end and the second end each having a rack attachment interface and a flip tray mounting interface.

6. The rack system of claim 5 wherein each rack attachment interface comprises a hook and a tab disposed to tool-lessly attach the flip tray mounting bracket with the rack standard interface portion.

7. The rack system of claim 5 wherein each flip tray mounting interface comprises an L-shaped slot.

8. The rack system of claim 1 wherein the flip tray further comprises at least one pull handle.

9. The rack system of claim 1 wherein the flip tray mounting bracket comprises a bottom support member in a generally horizontal disposition and the second position further comprising the flip tray disposed in a generally horizontal position in a plane lower than the horizontal plane of the bottom support.

10. The rack system of claim 1 wherein the flip tray further comprises a variety of perforations for promoting air flow therethrough.

11. A rack system for storing an information handling system component comprising:
a rack having four rails, each rail having a standard interface portion;
a cable management flip tray assembly comprising a flip tray mounting bracket and flip tray mounted thereto;
the flip tray mounting bracket selectively mounted to the standard interface portions of two rails;
the flip tray having at least one retainer for managing cabling associated with an information handling system stored in the rack, the flip tray selectively moveable between a first, generally vertical, position and a second, generally horizontal, position operable to facilitate access to the information handling system component stored with the rack;
the flip tray mounting bracket having a first end and a second end, the first end having a first flip tray mounting interface comprising a first L-shaped slot and the second end having a second flip tray mounting interface comprising a second L-shaped slot;
the flip tray having a first mounting member comprising a third L-shaped slot and a second mounting member comprising a fourth L-shaped slot;
the third L-shaped slot and the fourth L-shaped slot formed to align with the first L-shaped slot and the second L-shaped slot; and
a first pin extending through the first slot and the third slot and a second pin extending through the second slot and the fourth slot.

12. A cable management flip tray assembly comprising:
a flip tray mounting bracket and flip tray mounted thereto;
the flip tray mounting bracket operable to be selectively mounted to a rack;
the flip tray having at least one retainer for managing cabling associated with an associated information handling system stored in the rack, the flip tray selectively moveable between a first, generally vertical, position and a second, generally horizontal, position operable to facilitate access to the associated information handling system component stored within the rack;
the flip tray mounting bracket having a first end and a second end, the first end having a first flip tray mounting interface comprising a first L-shaped slot and the second end having a second flip tray mounting interface comprising a second L-shaped slot;
the flip tray having a first mounting member comprising a third L-shaped slot and a second mounting member comprising a fourth L-shaped slot;
the third L-shaped slot and the fourth L-shaped slot formed to align with the first L-shaped slot and the second L-shaped slot, respectively; and
a first pin extending through the first slot and the third slot and a second pin extending through the second slot and the fourth slot.

13. The cable management flip tray of claim 12 wherein the flip tray second position allows for the installation and removal of modular components into the associated information handling system.

14. The cable management flip tray of claim 12 further comprising the cable management flip tray assembly sized to be mounted in an approximately 5.25 inch vertical envelope within the rack.

15. The cable management flip tray of claim 12 wherein:
the flip tray mounting bracket comprises a first end and a second end connected by a bottom support member;
the first end and the second end having a generally vertical disposition, the bottom support having a generally horizontal disposition; and
the first end and the second end each having a rack attachment interface and a flip tray mounting interface.

16. The cable management flip tray of claim 12 wherein the flip tray mounting bracket comprises a bottom support member having a generally horizontal disposition corresponding to a horizontal plane and the flip tray second position further comprising the flip tray disposed in a generally horizontal position in a plane lower than the horizontal plane of the bottom support.

* * * * *